(12) United States Patent
Fukuzumi (10) Patent No.: US 6,363,009 B1
(45) Date of Patent: Mar. 26, 2002

(54) STORAGE DEVICE

(75) Inventor: Tomoya Fukuzumi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/677,878

(22) Filed: Oct. 3, 2000

(30) Foreign Application Priority Data

Apr. 20, 2000 (JP) ............................................ 12-119323

(51) Int. Cl.[7] .............................................. G11C 16/04
(52) U.S. Cl. ............................ 365/185.03; 365/185.33
(58) Field of Search ...................... 365/185.03, 185.11, 365/185.33, 185.24, 185.29

(56) References Cited

U.S. PATENT DOCUMENTS

| | | | | |
|---|---|---|---|---|
| 5,592,641 A | * | 1/1997 | Fandrich et al. | 365/185.11 |
| 6,075,723 A | * | 6/2000 | Naiki et al. | 365/185.03 |
| 6,125,061 A | * | 9/2000 | Mitani | 365/185.33 |
| 6,151,247 A | * | 11/2000 | Estakhri et al. | 365/185.11 |
| 6,163,485 A | * | 12/2000 | Kawahara et al. | 365/185.24 |

FOREIGN PATENT DOCUMENTS

| | | |
|---|---|---|
| JP | 11-031102 | 2/1999 |
| JP | 11-224491 | 8/1999 |

* cited by examiner

Primary Examiner—Trong Phan
(74) Attorney, Agent, or Firm—Oblon, Spivak, McClelland, Maier & Neustadt, P.C.

(57) ABSTRACT

A two-valued flash memory (2) and multivalued flash memories (31–33) are mixed in a flash memory group (200) so that management data and user data are stored into the two-valued flash memory (2) and the multivalued flash memories (31–33), respectively. A CPU (4) operates based on universal physical addresses. On the other hand, a two-valued/multivalued selector (7), and a two-valued flash sequencer (6a) and a multivalued flash sequencer (6b) in a flash interface (6) operate based on individual physical addresses so that the management data and the user data to be transmitted/received are divided among the two-valued flash memory (2) and the multivalued flash memories (31–33). This increases storage capacity and transfer rate of a flash storage medium.

12 Claims, 11 Drawing Sheets

| UNIVERSAL PHYSICAL ADDRESS | STORED CONTENTS | FLASH MEMORY TYPE |
|---|---|---|
| FFFFh<br>•<br>•<br>•<br>C000h | USER DATA III | MULTIVALUED FLASH MEMORY 33 |
| BFFFh<br>•<br>•<br>•<br>8000h | USER DATA II | MULTIVALUED FLASH MEMORY 32 |
| 7FFFh<br>•<br>•<br>•<br>4000h | USER DATA I | MULTIVALUED FLASH MEMORY 31 |
| 3FFFh<br>•<br>•<br>•<br>0000h | MANAGEMENT DATA | TWO-VALUED FLASH MEMORY 2 |

| CASE | UNIVERSAL PHYSICAL ADDRESS | INDIVIDUAL PHYSICAL ADDRESS 15 | FLASH MEMORY SELECTION SIGNAL 17 | | | | SELECTION SIGNAL 8 |
|---|---|---|---|---|---|---|---|
| | | | b3 | b2 | b1 | b0 | |
| (1) | 010Fh | 010Fh | H | H | H | L | L |
| (2) | 51FEh | 11FEh | H | H | L | H | H |
| (3) | BFDEh | 3FDEh | H | L | H | H | H |
| (4) | D123h | 1123h | L | H | H | H | H |

| UNIVERSAL PHYSICAL ADDRESS | STORED CONTENTS | FLASH MEMORY TYPE |
|---|---|---|
| FFFFh ⋮ C100h | USER DATA IV | TWO-VALUED/MULTIVALUED FLASH MEMORY 94 |
| C0FFh ⋮ C000h | MANAGEMENT DATA IV | |
| BFFFh ⋮ 8100h | USER DATA III | TWO-VALUED/MULTIVALUED FLASH MEMORY 93 |
| 80FFh ⋮ 8000h | MANAGEMENT DATA III | |
| 7FFFh ⋮ 4100h | USER DATA II | TWO-VALUED/MULTIVALUED FLASH MEMORY 92 |
| 40FFh ⋮ 4000h | MANAGEMENT DATA II | |
| 3FFFh ⋮ 0100h | USER DATA I | TWO-VALUED/MULTIVALUED FLASH MEMORY 91 |
| 00FFh ⋮ 0000h | MANAGEMENT DATA I | |

| CASE | UNIVERSAL PHYSICAL ADDRESS | INDIVIDUAL PHYSICAL ADDRESS 26 | FLASH MEMORY SELECTION SIGNAL 30 | | | | SELECTION SIGNAL 28 |
|---|---|---|---|---|---|---|---|
| | | | b3 | b2 | b1 | b0 | |
| (1) | 000Fh | 000Fh | H | H | H | L | L |
| (2) | 2FFEh | 2FFEh | H | H | H | L | H |
| (3) | 40FEh | 00FEh | H | H | L | L | L |
| (4) | 6FCDh | 2FCDh | H | H | L | H | H |
| (5) | 8080h | 0080h | H | L | H | H | L |
| (6) | 8122h | 0122h | H | L | H | H | H |
| (7) | C0EEh | 00EEh | L | H | H | H | L |
| (8) | D123h | 1123h | L | H | H | H | H |

STORAGE DEVICE

BACKGROUND OF THE INVENTION

1. Field of the Invention

The present invention relates to a storage device especially equipped with both two-valued memory to handle the binary logic and multivalued memory to handle three or more logical values.

2. Description of the Background Art

Flash storage media, each equipped with flash memories suitable for an increase in storage capacity as its memory elements, are commonly used as information storage devices. With the diversification of information, the flash storage media are required to meet two demands: further increase in storage capacity and speeding up of data transfer.

Figure 10A:
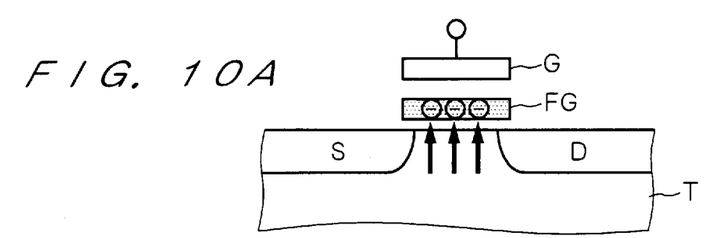
FIG. 10 is a cross-sectional view showing a conventional technique.
Figure 10B:
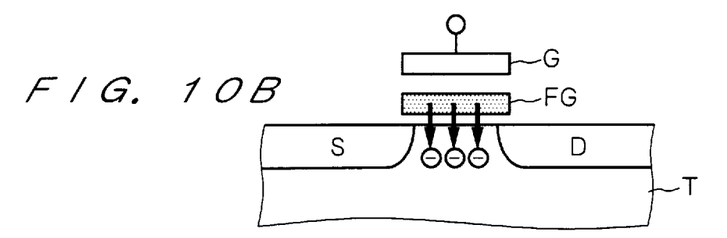
Figure 10C:
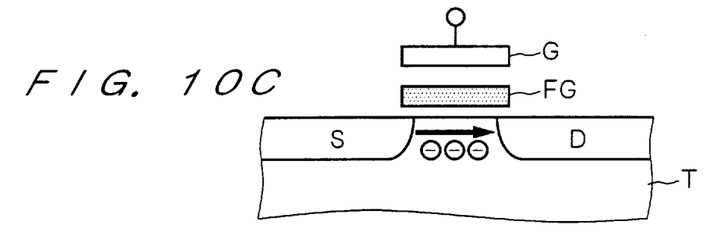

In terms of an increase in storage capacity, techniques of multivalued flash memories each handling three or more logical values have been proposed. FIGS. 10A, 10B, and 10C are cross-sectional views conceptually illustrating the operation of one of such flash memories. In FIGS. 10A to 10C, for example, n-type source S and drain D are spaced from each other in the surface of a p-type semiconductor substrate T. Above the area between the source S and the drain D, a floating gate FG and a gate G, isolated from each other, are provided in that order.

FIG. 10A shows the writing state wherein electrons (indicated by circled minus signs in the figures) are drawn into the floating gate FG from the surface of the semiconductor substrate T between the source S and the drain D. This is performed by the application of a positive voltage to the gate G. For two-valued flash memories, only a single kind of positive voltage is applied during a write operation and the writing state is set to be a "0" logic state. For multivalued flash memories such as the one handling four logical values, on the other hand, three kinds of positive voltages are set for application to the gate G and the writing state is set to either of logical values "10", "00", and "01" in descending order of positive voltage.

FIG. 10B shows the erasing state wherein electrons are sent from the floating gate FG into the surface of the semiconductor substrate T between the source S and the drain D. This is performed by the application of a high negative voltage to the gate G. In this case, only a single kind of negative voltage is adopted irrespective of whether the flash memory is two-valued or multivalued type. The erasing state is set to a logical value "1" for two-valued flash memories and "11" for multivalued flash memories.

FIG. 10C shows the reading state wherein a conductive channel is created between the source S and the drain D by the application of a voltage to the gate G. The threshold voltage in the writing state is higher than that in the erasing state.

Figure 11:
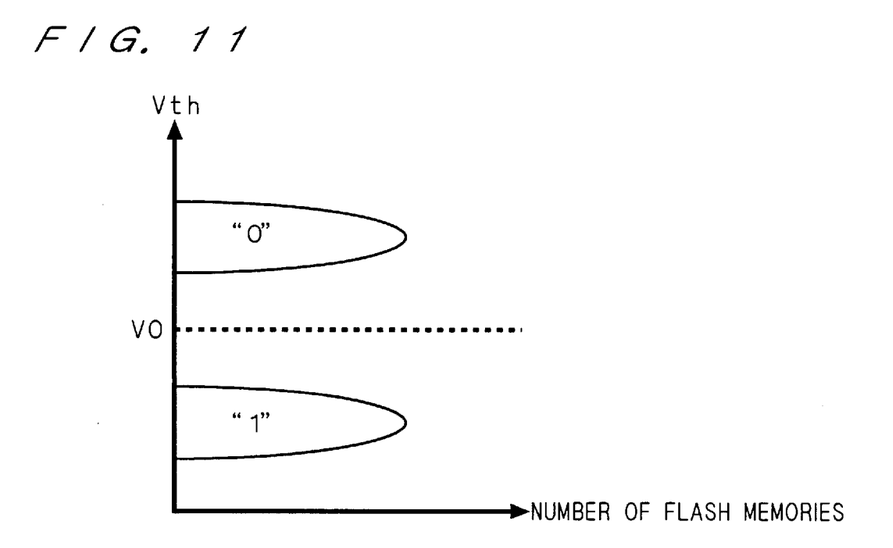
FIGS. 11 and 12 are graphs showing the conventional technique.
Figure 12:
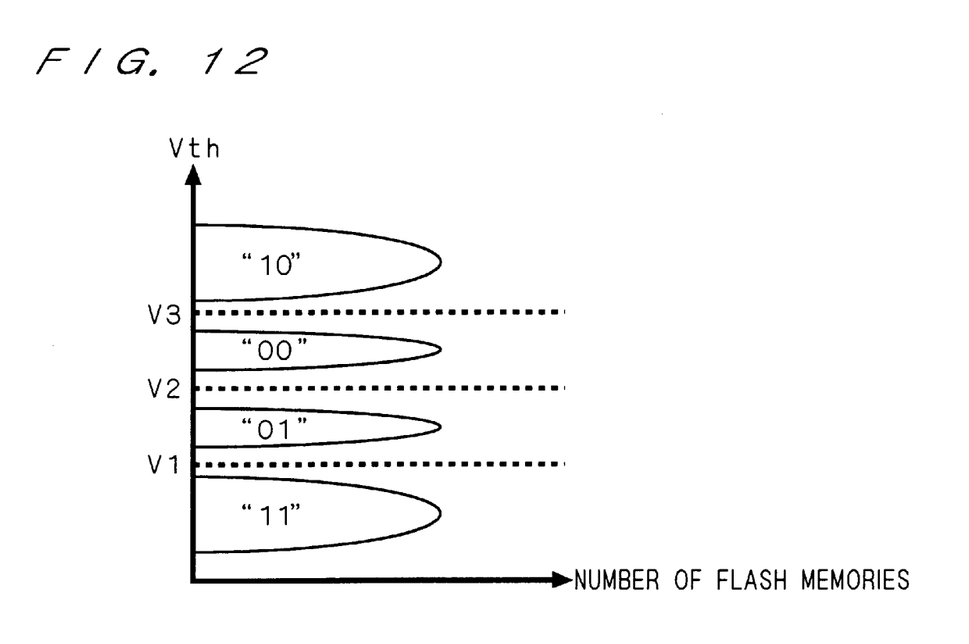

FIG. 11 is a graph showing the distribution of the threshold voltage Vth of a two-valued flash memory and FIG. 12 shows the same of a four-valued flash memory. In the two-valued flash memory, as shown in FIG. 11, the distribution of the threshold voltage Vth divides into two sections at a voltage V0. Thus, whether the logic state is "1" or "0" is determined or read out by applying the voltage V0 to the gate G to see whether or not current flows between the source S and the drain D.

In the four-valued flash memory, on the other hand, the distribution of the threshold voltage Vth divides into four sections at three voltages V1, V2, and V3 as boundaries as shown in FIG. 12. Thus, by applying the three voltages V1, V2, and V3 to the gate G, the logic state "10", "00", "01", or "11" is read out.

The multivalued flash memories are suitable for an increase in storage capacity but not for an increase in transfer rate since its read operation requires a plurality of voltages. Conversely, the two-valued flash memory is suitable for rapid data transfer but not for large-capacity storage.

Now, data handled in such flash memories fall into two broad categories: management data including parameters necessary for internal processing in the flash storage media; and user data for use by users. The management data is read out in small different quantities over several times when a flash storage medium is accessed. Therefore, the reading speed for the management data impacts significantly on the transfer rate. On the other hand, it is preferable for the flash memories to handle the user data in large quantity.

The techniques for dividing data among two-valued and multivalued storage areas in a storage device are disclosed for example in Japanese Patent Application Laid-Open Nos. 11-31102 (1999) and 11-224491 (1999).

SUMMARY OF THE INVENTION

A first aspect of the present invention is directed to a storage device comprising: a first storage area for reading a storage state with a single readout voltage; and a second storage area for reading a storage state with a plurality of readout voltages, wherein the first storage area stores management data and the second storage area stores user data.

According to a second aspect of the present invention, in the storage device of the first aspect, the first and second storage areas use independent individual physical addresses for storing the management data and the user data, respectively. The storage device further comprises: a CPU exercising overall control using universal physical addresses which handle all of the individual physical addresses in a uniform manner.

According to a third aspect of the present invention, in the storage device of the second aspect, the universal physical addresses each include a selection bit for use in determining in which of the first and second storage areas one of the individual physical addresses is to be used, and bits indicating the one of the individual physical addresses.

According to a fourth aspect of the present invention, in the storage device of the first aspect, the first and the second storage areas are associated with each other, the first storage area including a plurality of first storage areas and the second storage area including a plurality of second storage areas; corresponding ones of the first and second storage areas which are associated with each other form a single storage element based on a mapping of individual physical addresses, the first and second storage areas storing the management data and the user data, respectively, by the individual physical addresses; and each of the storage elements individually uses the individual physical addresses. The storage device further comprises: a CPU exercising overall control using universal physical addresses which handle all of the individual addresses in a uniform manner.

According to a fifth aspect of the present invention, in the storage device of the fourth aspect, the universal physical addresses each include a selection bit for use in determining in which of the first and second storage areas one of the individual physical addresses is to be used, and bits indicating the one of the individual physical addresses.

In accordance with the storage device of the first aspect, the management data requiring a rapid readout is stored in the first storage area which uses a single readout voltage for reading, while the user data requiring large storage capacity is stored in the second storage area which uses a plurality of readout voltages for reading. This increases data transfer rate and storage capacity.

In accordance with the storage device of the second and fourth aspects, the CPU can exercise overall control without considering in which of the first and second storage areas the management data or the user data is to be stored.

In accordance with the storage device of the third aspect, the universal physical address reflects in which of the first and second storage areas the individual physical address is to be used. This makes it easy to divide the management data and the user data to be received/transmitted among the first storage area and the second storage area.

In accordance with the storage device of the fifth aspect, the universal physical address reflects in which storage element the individual address physical is to be used. This makes it easy to divide the management data and the user data to be transmitted/received among the first storage area and the second storage area.

An object of the present invention is to provide a storage device mixing a two-valued storage area for storing management data and a multivalued storage area for storing user data, and especially, a technique for dividing the above two types of data to be transmitted/received, by controlling physical memories in each flash memory.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
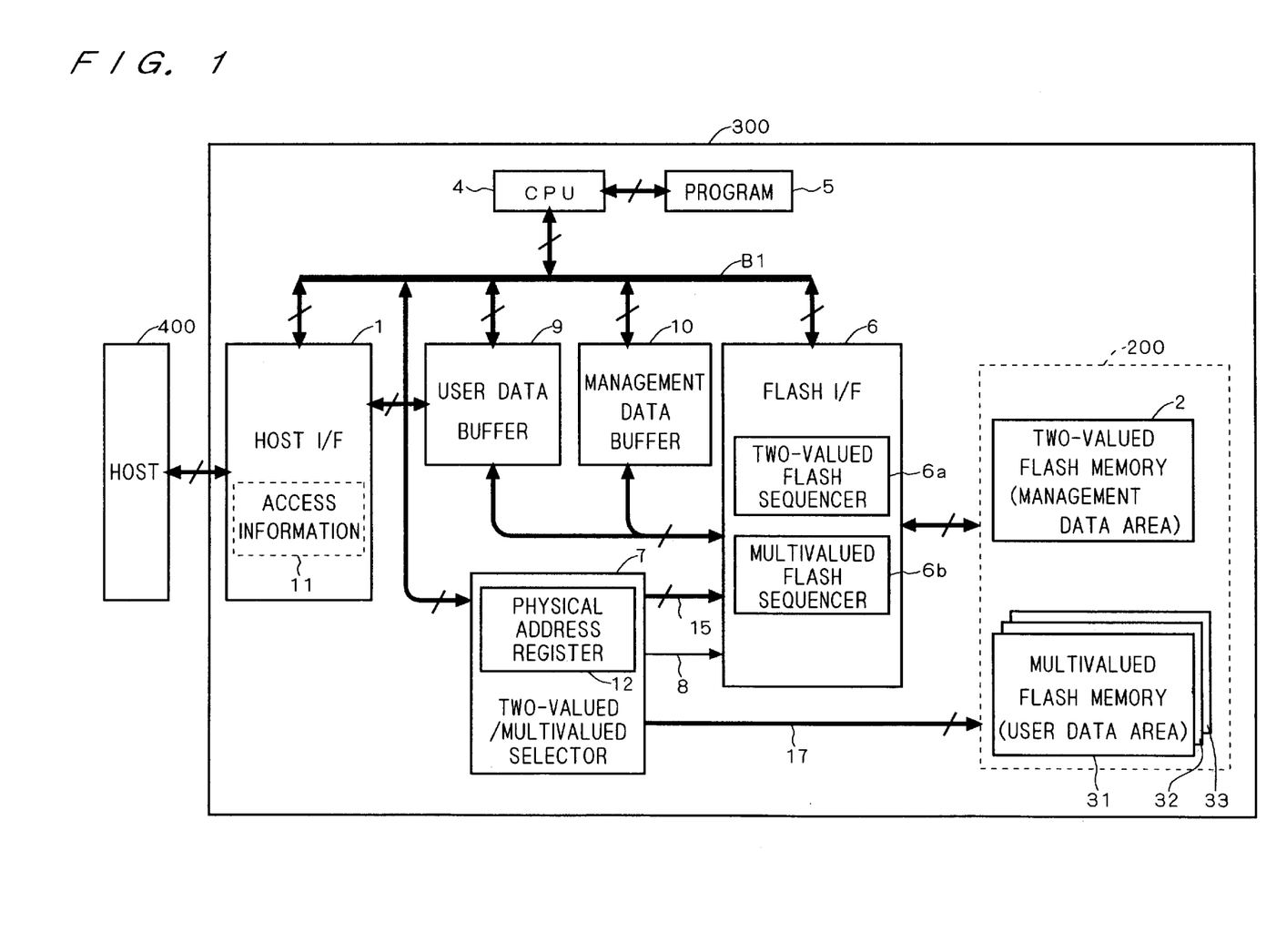
FIG. 1 is a block diagram of a configuration according to a first preferred embodiment of the present invention.

FIG. 1 is a block diagram of a general configuration of a flash storage medium 300 as one example of a storage device according to a first preferred embodiment of the present invention.

Serving as a storage device for a host 400, the flash storage medium 300 comprises a host interface 1 for data transfer from and to the host 400.

The flash storage medium 300 also comprises a flash memory group 200 which includes a two-valued flash memory 2 as a first storage area and multivalued flash memories 31 to 33 as second storage areas.

The two-valued flash memory 2 is used as a management data area for storing management data or parameters necessary for internal processing in the flash storage medium 300. The multivalued flash memories 31 to 33 are used as user data areas for storing user data.

The operation of the flash memory group 200 is directly controlled by a flash interface 6 provided in the flash storage medium 300, with the exception of a flash memory selection signal 17 which will be described later. The flash interface 6 comprises a two-valued flash sequencer 6a to control the two-valued flash memory 2, and a multivalued flash sequencer 6b to control the multivalued flash memories 31 to 33. Those two sequencers 6a and 6b may be independent of each other in configuration as illustrated in blocks or the flash interface 6 may have the functions of both the two sequencers 6a and 6b.

The flash memory 6 is connected to a user data buffer 9 and a management data buffer 10, which are provided in the flash storage medium 300, to transmit and receive the user data and the management data, respectively. Transmitting/receiving those data to/from the flash memory group 200 is also one of the functions performed by the flash interface 6.

The functions of the sequencers 6a and 6b are switched on or off by a selection signal 8 from a two-valued/multivalued selector 7 in the flash storage medium 300. The two-valued/multivalued selector 7 also gives the flash memory selection signal 17 to the flash memory group 200.

The host interface 1, the flash interface 6, the user data buffer 9, and the management data buffer 10 are connected via a bus B1 to a central processing unit (CPU) 4 in the flash storage medium 300. The CPU 4 controls the overall operations of those units, using the management data, according to a program 5 that describes the internal processing flow.

Figure 2:
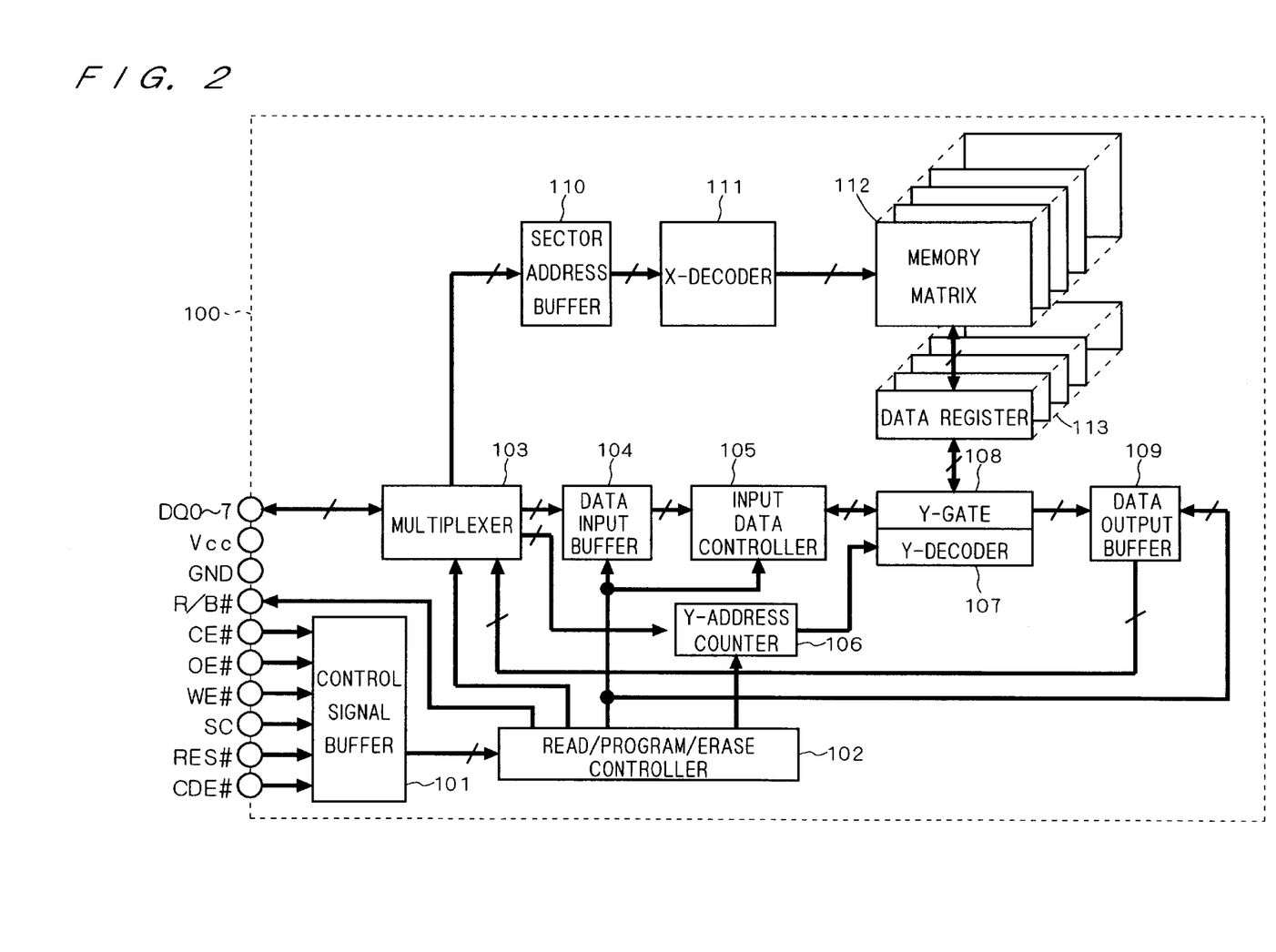
FIG. 2 is a block diagram of a general construction of a flash memory.

FIG. 2 is a block diagram of a general construction of a typical flash memory 100 adaptable to all the two-valued flash memory 2 and the multivalued flash memories 31 to 33.

The flash memory 100 is given the source potential at its power terminal Vcc and the ground potential at its ground terminal GND. A control signal buffer 101 in the flash memory 100 receives and temporarily stores various control signals. More specifically, the control signal buffer 101 receives a chip enable signal at its terminal CE#, an output enable signal at its terminal OE#, a write enable signal at its terminal WE#, a serial clock signal at its terminal SC, a reset signal at its terminal RES#, and a command enable signal at its terminal CDE#. Herein, the control signals given at the terminals whose names ending in "#" are active LOW. All the control signals are fed to a read/program/erase controller 102 in the flash memory 100. In synchronization with the serial clock signal, the flash memory 100 having a sector structure inputs and outputs data from and to terminals DQ0 to DQ7.

The flash memory 100 further comprises a multiplexer 103, a data input buffer 104, an input data controller 105, an output data buffer 109. The multiplexer 103 outputs data to the data input buffer 104 and inputs data from the data output buffer 109. The input data controller 105 controls the input of data to a Y-gate 108 which will be described later. The multiplexer 103 also outputs X-address and Y-address information to a sector address buffer 110 and a Y-address counter 106 both in the flash memory 100, respectively.

The multiplexer 103, the data input buffer 104, the input data controller 105, the Y-address counter 106, and the data output buffer 109 each operate under control of the read/program/erase controller 102. According to the operating status of each unit, the read/program/erase controller 102 outputs to a terminal R/B# a busy/ready signal that indicates whether the flash memory 100 is busy or not.

The flash memory 100 further comprises an X-decoder 111 and a Y-decoder 107 which decode an X-address and a Y-address received from the sector address buffer 110 and the Y-address counter 106, respectively.

The flash memory 100 still further comprises memory matrices 112 each having an array of flash memory cells, and data registers 113 for storing data in sector units. For example, the number of memory matrices 112 is equal to that of the data registers 113. The input/output of data to/from the memory matrices 112 are performed through the data registers 113 and the Y-gate 108.

The flash memory 100 includes $2^{14}$ sectors, for example. When any of the multivalued flash memories 31 to 33 is configured to attain sector size equal to that of the two-memory flash memory 2, each of the two-valued flash memory 2 and the multivalued flash memories 31 to 33 in the flash memory group 200 of FIG. 1 individually use physical addresses 0000h through 3FFFh (which are hereinafter referred to as "individual physical addresses").

Referring back to FIG. 1, the CPU 4 adopts universal physical addresses, as physical addresses, which are common to all the two-flash memory 2 and the multivalued flash memories 31 to 33. The flash interface 6, on the other hand, operates using the individual physical addresses.

Figure 3:
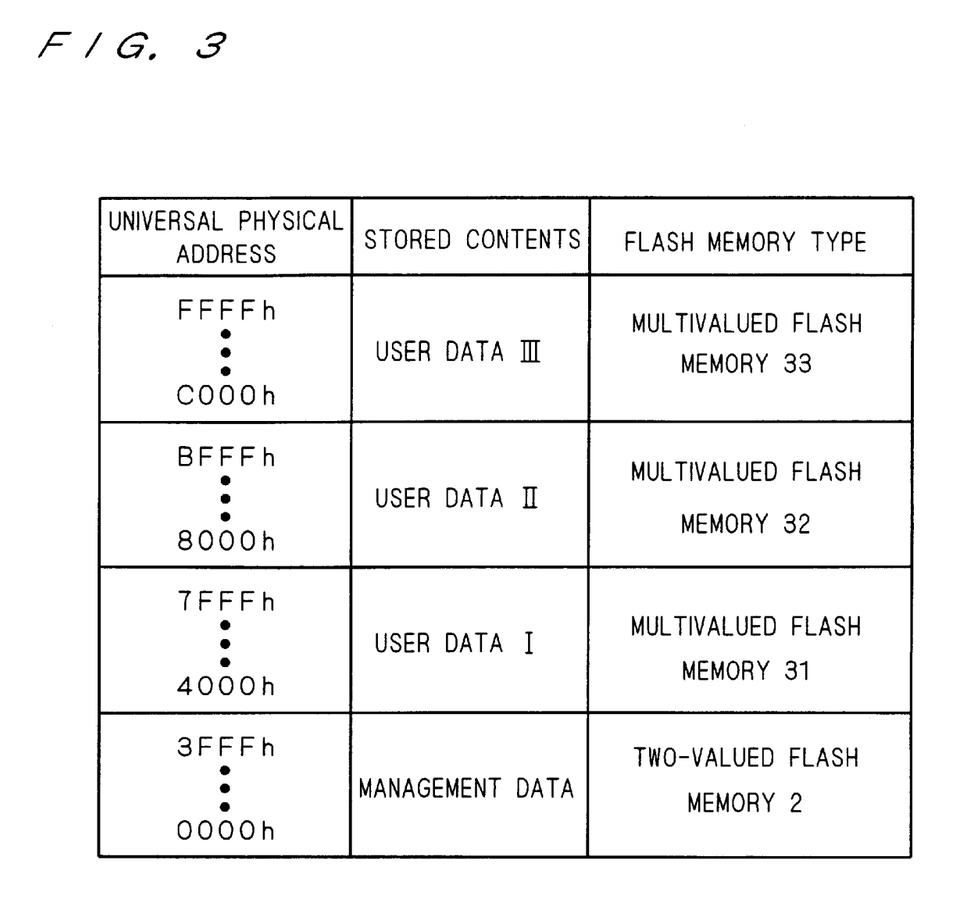
FIG. 3 illustrates the operation according to the first preferred embodiment.

FIG. 3 shows a memory map of the universal physical addresses. The individual physical addresses of the two-valued flash memory 2 are used also as universal physical addresses. The individual physical addresses of the multi-valued flash memories 31 to 33 are increased by 4000h, 8000h, and C000h, respectively, to be used as universal physical addresses. More specifically, the two-valued flash memory 2 or area for storing the management data is assigned universal physical addresses 0000h to 3FFFh; the multivalued flash memory 31 or area for storing part of the user data, namely user data I, is assigned integral physical addresses 4000h through 7FFFh; the multivalued flash memory 32 or area for storing part of the user data, namely user data II, is assigned universal physical addresses 8000h through BFFFh; and the multivalued flash memory 33 or area for storing part of the user data, namely user data III, is assigned universal physical addresses C000h through FFFFh. Thus, while a 14-bit address signal is used for each individual physical address, 16-bit address signals are used for universal physical addresses. Hereinbelow, a construction required to achieve the correspondence of FIG. 3 will be described.

Figure 4:
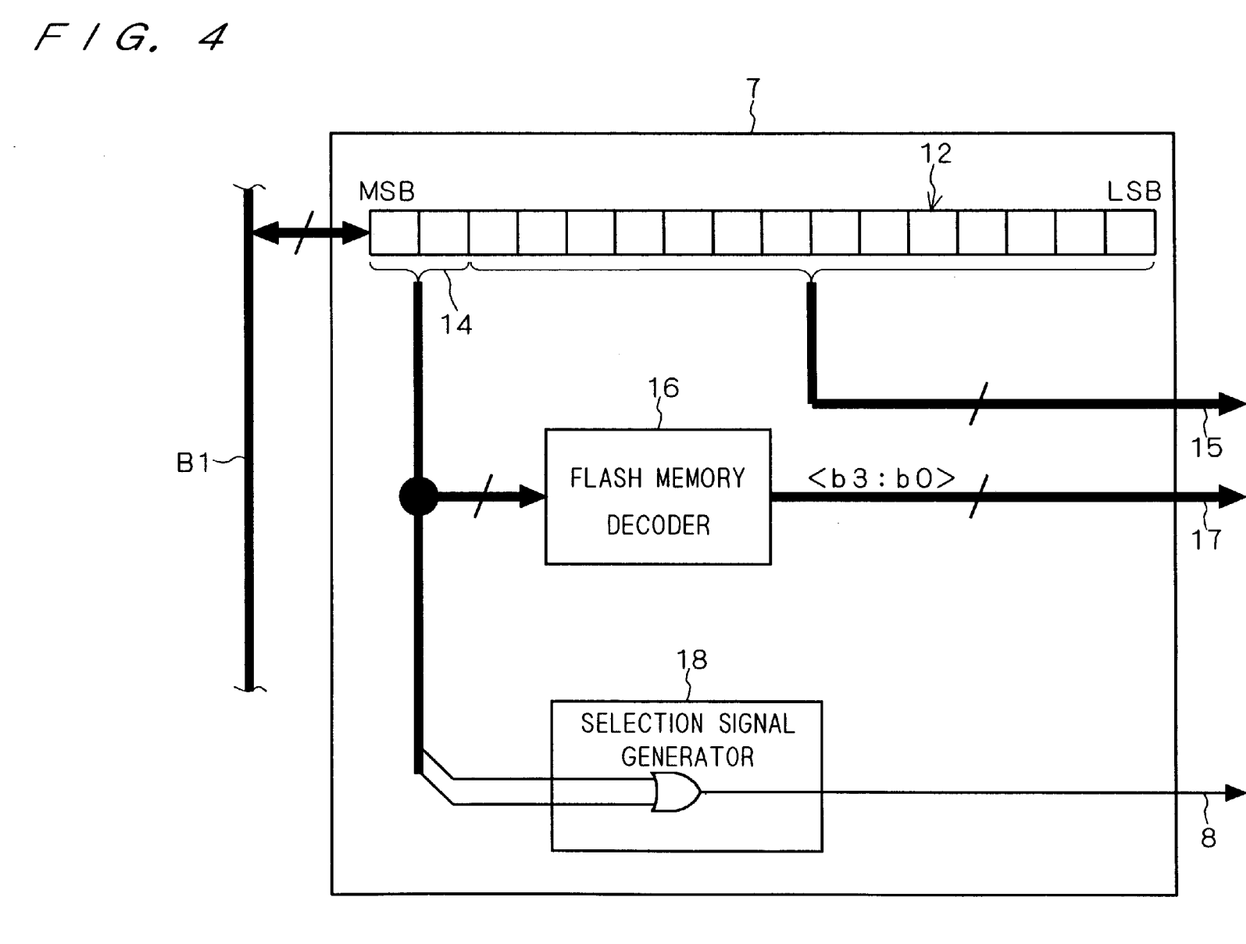
FIG. 4 is a block diagram of another configuration according to the first preferred embodiment.

FIG. 4 is a block diagram of a general construction of the two-valued/multivalued sector 7. The two-valued/multivalued sector 7 is connected via the bus B1 to the CPU 4 and comprises a physical address register 12 for storing an universal physical address. Two bits of the universal physical address, including the most significant bit MSB and the next low-order bit, serve as selection bits 14, and the remaining 14 bits as an individual physical address 15.

The individual physical address 15 is given to the flash interface 6. The selection bits 14, on the other hand, are given to a flash memory decoder 16 and a selection signal generator 18 both in the two-valued/multivalued selector 7. The flash memory decoder 16 generates the flash memory selection signal 17 and the selection signal generator 18 generates the selection signal 8.

The flash memory selection signal 17 is 4 bits in length <b3:b0>. Of the bits b0, b1, b2, and b3, only one bit becomes LOW in response to the selection bits 14 (i.e., b0 for "00", b1 for "01", b2 for "10", and b3 for "11") and the other bits become HIGH. The bits b0, b1, b2, and b3 are given to the terminals CE# (cf. FIG. 2) of the two-valued flash memory 2 and the multivalued flash memories 31, 32, and 33, respectively, to serve as chip enable signals.

The selection signal 8 becomes LOW only when the selection bits 14 are "00" and HIGH when they are "01", "10" or "11". That is, the selection signal generator 18 provides the function of calculating the logical OR of the selection bits 14.

Figure 5:
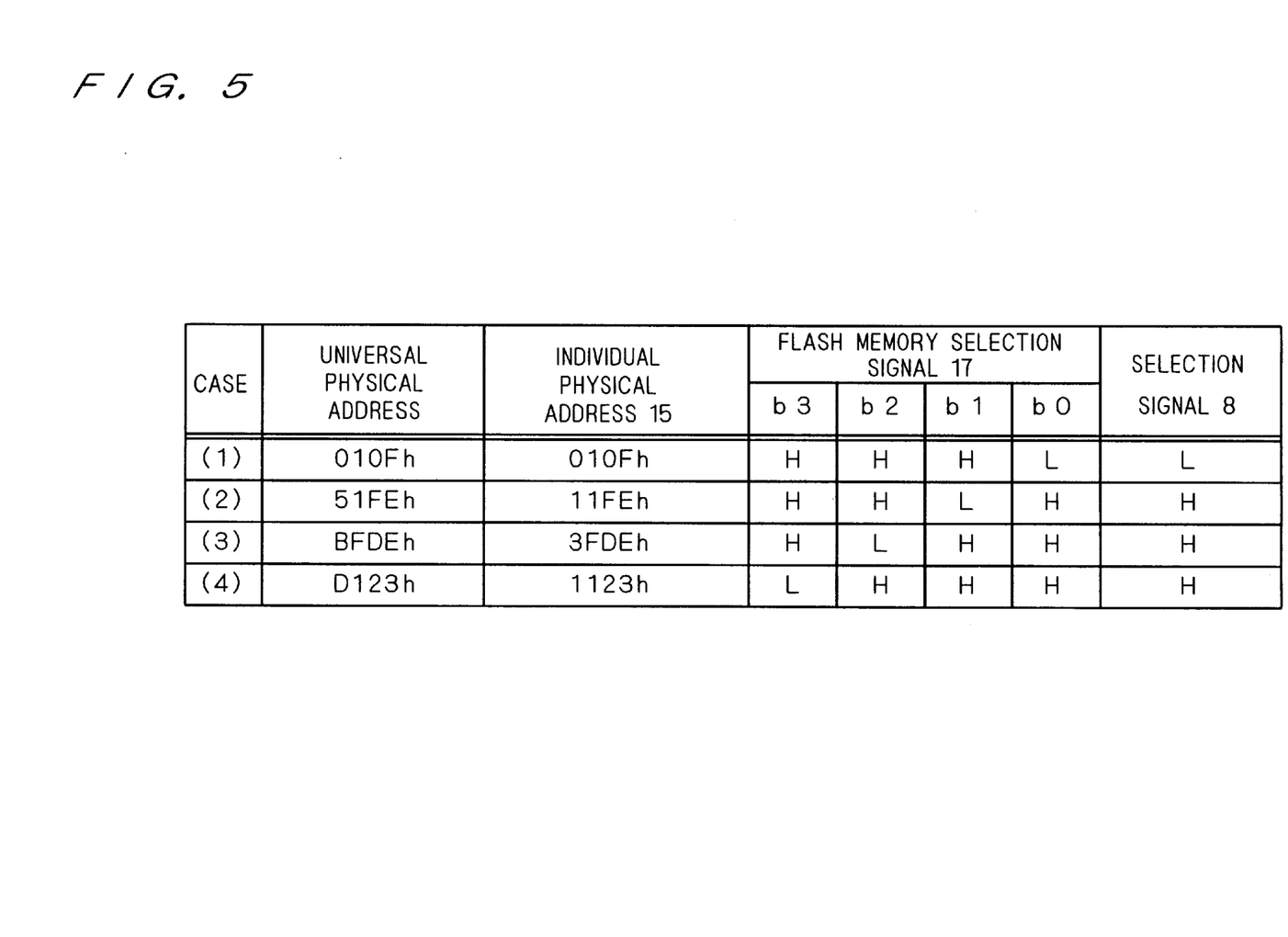
FIG. 5 illustrates the operation according to the first preferred embodiment.

FIG. 5 shows the relative relations of the universal physical address, the individual physical address, the flash memory selection signal 17, and the selection signal 8 in various cases. In the case (1) for an universal physical address "010Fh", the selection bits 14 are "00" and the individual physical address 15 is "010Fh". Thus, only the bit b0 of the flash memory selection signal 17 becomes LOW and the bits b1, b2 and b3 become HIGH. This causes only the terminal CE# of the two-valued flash memory 2 to be set LOW, enabling access to the two-valued flash memory 2. The selection signal 8 becomes LOW, and the flash interface 6, upon receiving that signal, activates the function of the two-valued flash sequencer 6a. Accordingly, it follows from FIG. 3 that the universal physical address "010Fh" corresponds to the individual physical address "010Fh" in the two-valued flash memory 2, which is used for the input/output of the management data.

In the case (2) for an universal physical address "51FEh", the selection bits 14 are "01" and the individual physical address 15 is "11FEh". Thus, only the bit b1 of the flash memory selection signal 17 becomes LOW and the bits b0, b2, and b3 become HIGH. This causes only the terminal CE# of the multivalued flash memory 31 to be set LOW, enabling access to the multivalued flash memory 31. The selection signal 8 becomes HIGH, and the flash interface 6, upon receiving that signal, activates the function of the multivalued flash sequencer 6b. Accordingly, it follows from FIG. 3 that the universal physical address "51FEh" corresponds to the individual physical address "11FEh" in the multivalued flash memory 31, which is used for the input/output of the user data I.

In the case (3) for an universal physical address "BFDEh", the selection bits 14 are "10" and the individual physical address 15 is "3FDEh". Thus, only the bit b2 of the flash memory selection signal 17 becomes LOW and the bits b0, b1, and b3 become HIGH. This causes only the terminal CE# of the multivalued flash memory 32 to be set LOW, thus enabling access to the multivalued flash memory 32. The selection signal 8 becomes HIGH, and the flash interface 6, upon receiving that signal, activates the function of the multivalued flash sequencer 6b. Accordingly, it follows from FIG. 3 that the universal physical address "BFDEh" corresponds to the individual physical address "3FDEh" in the multivalued flash memory 32, which is used for the input/output of the user data II.

In the case (4) for an universal physical address "D123h", the selection bits 14 are "11" and the individual physical address 15 is "1123h". Thus, only the bit b3 of the flash memory selection signal 17 becomes LOW and the bits b0, b1, and b2 become HIGH. This causes only the terminal CE# of the multivalued flash memory 33 to be set LOW, thus enabling access to the multivalued flash memory 33. The selection signal 8 becomes HIGH, and the flash interface 6, upon receiving that signal, activates the function of the multivalued flash sequencer 6b. Accordingly, it follows from FIG. 3 that the universal physical address "D123h" corresponds to the individual physical address "1123h" in the multivalued flash memory 33, which is used for the input/output of the user data III.

Referring back to FIG. 1, the CPU 4 obtains access information 11 given from the host 400 via the host interface 1. The access information 11 indicates which of read, write, and erase (read/program/erase) operations is the request from the host 400 to the flash storage medium 300.

According to the access information 11, the CPU 4 requests the flash interface 6 to read the management data necessary for internal processing in the flash storage medium 300. The required internal processing differs according to which of the read, write, and erase operations is requested by the host 400.

At this time, the CPU 4 uses the universal physical addresses in the range of 0000h to 3FFFh. Thus, only the bit b0 of the flash memory selection signal 17 from the two-valued/multivalued selector 7 becomes LOW and the selection signal 8 becomes LOW. This brings the two-valued flash memory 2 into the chip enable state, from which memory the management data is read out and then stored into the management data buffer 10 by the function of the two-valued flash sequencer 6a.

When the request from the host 400 is either the read or write operation according to the access information 11, physical addresses of user data to be read or written (which are administrated under the host 400) are converted into the universal physical addresses 4000h through FFFFh according to a management table not shown (which is for example stored in a RAM attached to the core of the CPU 4). Then, the CPU 4 requests the flash interface 6 to read or write the user data on the basis of the management data stored in the management data buffer 10.

Those universal physical addresses of the user data are transmitted to the two-valued/multivalued selector 7, which then outputs the flash memory selection signal 17. At this time, only either one of the bits b1, b2 and b3 of the flash memory selection signal 17 becomes LOW and the selection signal 8 becomes HIGH. This brings either one of the multivalued flash memories 31 to 33 into the chip enable state, from or on which memory the user data is read or written by the function of the multivalued flash sequence 6b. Of course, the user data may use the universal physical addresses 7FFFh and 8000h or BFFFh and C000h consecutively. In these cases, access shifts from the flash memory 31 to the flash memory 32 or from the flash memory 32 to the flash memory 33.

In a read operation, the user data from either of the multivalued flash memories 31 to 33 is stored into the user data buffer 9 via the flash interface 6. Then, the CPU 4 transmits the user data stored in the user data buffer 9 via the host interface 1 to the host 400.

In a write operation, the user data is once stored into the user data buffer 9 via the host interface 1 and the bus B1, and then stored into either of the multivalued flash memories 31 to 33 via the flash interface 6.

As has been described, in the first preferred embodiment, the two-valued flash memory 2 and the multivalued flash memories 31 to 33 are mixed so that the management data and the user data to be transmitted/received are divided among the two-valued flash memory 2 and the multivalued flash memories 31 to 33. This achieves higher transfer rate and larger storage capacity.

Further, while the CPU 4 controls each unit using the universal physical addresses which handle individual physical data in a uniform manner, the two-valued/multivalued selector 7 and the flash interface 6 divide data to be stored among the two-valued flash memory 2 and the multivalued flash memories 31 to 33. Thus, it is not necessary for the CPU 4 during processing to consider the above mixture of the flash memories in the flash memory group 200 and to make significant modification to the program 5. Especially the universal physical addresses each including the selection bits 14 and the individual physical address 15 facilitate such division for data reception and transmission.

Second Preferred Embodiment

Figure 6:
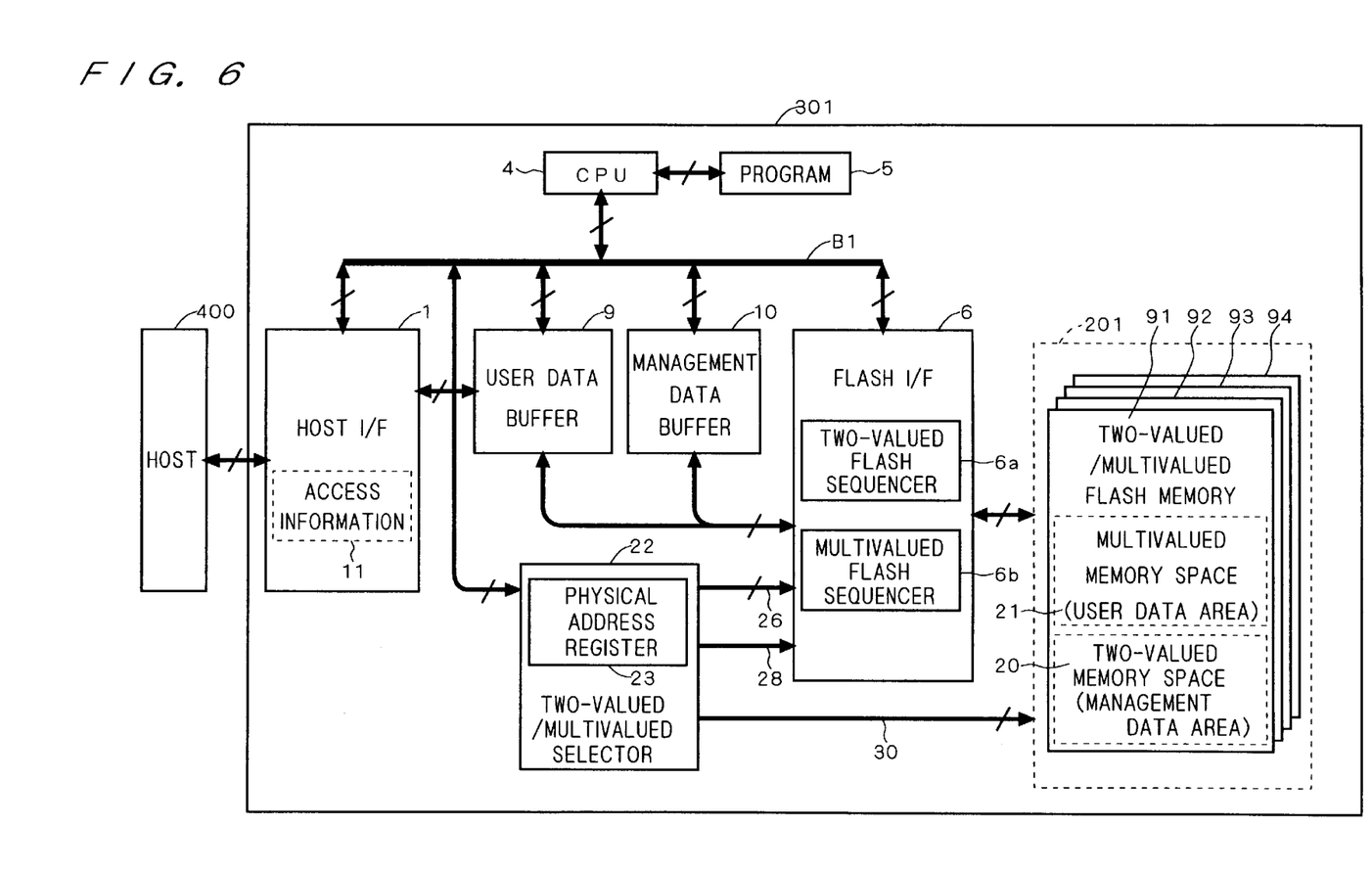
FIG. 6 is a block diagram of a configuration according to a second preferred embodiment of the present invention.

FIG. 6 is a block diagram of a general configuration of a flash storage medium 301 as one example of a storage device according to a second preferred embodiment. Like the flash storage medium 300, the flash storage medium 301 also serves as a storage device for the host 400.

In the flash storage medium 301, the two-valued/multivalued selector 7 and the flash memory group 200 in the flash storage medium 300 are substituted by a two-valued/multivalued selector 22 and a flash memory group 201, respectively.

The flash memory group 201 includes a plurality of, in this case, four two-valued/multivalued flash memories 91, 92, 93, and 94. The two-valued/multivalued flash memories 91 to 94 each have a two-valued memory space 20 as a management data area and a multivalued memory space 21 as a user data area. For example, each of the two-valued/multivalued flash memories 91 to 94 has $2^{14}$ sectors and bases on each mapping of individual physical addresses 0000h through 3FFFh. More specifically, the two-valued memory space 20 is assigned individual physical addresses 0000h through 00FFh and the multivalued memory space 20 is assigned individual physical addresses 0100h through 3FFFh.

The input and output of data and the control on the two-valued memory space 20 and the multivalued memory space 21 are performed by the functions of the two-valued sequencer 6a and the multivalued flash sequencer 6b, respectively. Which of the functions of the two-valued sequencer 6a and the multivalued sequencer 6b is to be adopted is determined by a selection signal 28 outputted from the two-valued/multivalued selector 22. Further, which of the two-valued/multivalued flash memories 91 to 94 is to be accessed is determined by a flash memory selection signal 30 outputted from the two-valued/multivalued selector 22.

Figure 7:
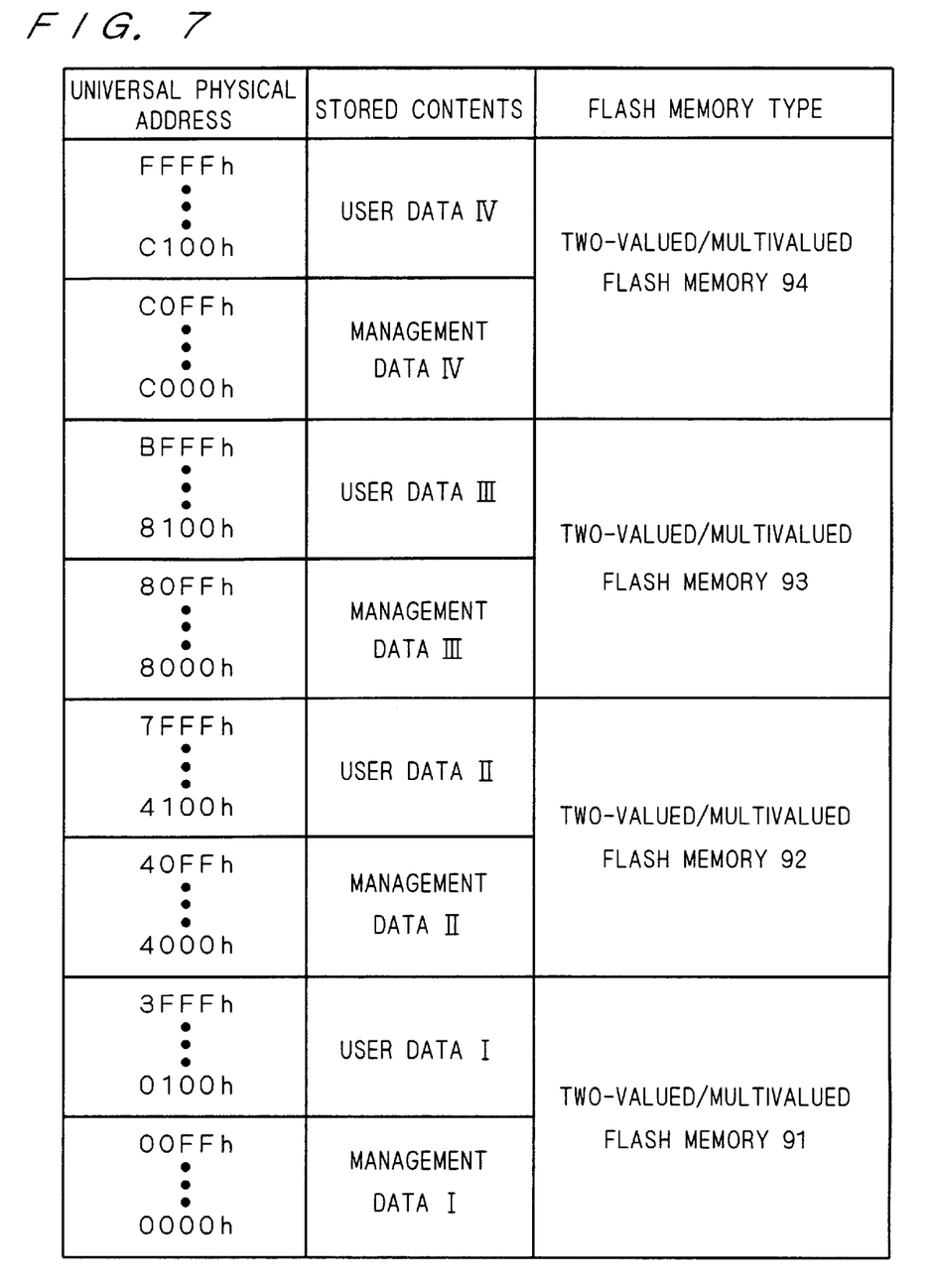
FIG. 7 illustrates the operation according to the second preferred embodiment.

FIG. 7 shows a memory map of universal physical addresses. Since the two-valued/multivalued flash memories 91 to 94, the number of which are $2^2$, each has $2^{14}$ sectors, 16-bit address signals are used for universal physical addresses as in the first preferred embodiment. The universal physical addresses are set from 0000h to FFFFh. More specifically, the two-valued memory space 20 in the two-valued/multivalued flash memory 91 is assigned universal physical addresses 0000h to 00FFh at which part of the management data, namely management data I, is stored. The multivalued memory space 21 in the flash memory 91 is assigned universal physical addresses 0100h to 3FFFh at which part of the user data, namely user data I, is stored.

Similarly in the two-valued/multivalued flash memory 92, the two-valued memory space 20 is assigned universal physical addresses 4000h to 40FFh at which part of the management data, namely management data II, is stored; and the multivalued memory space 21 is assigned universal physical addresses 4100h to 7FFFh at which part of the user data, namely user data II, is stored. In the two-valued/multivalued flash memory 93, the two-valued memory space 20 is assigned universal physical addresses 8000h to 80FFh at which part of the management data, namely management data III, is stored; and the multivalued memory space 21 is assigned universal physical addresses 8100h to BFFFh at which part of the user data, namely user data III, is stored. In the two-valued/multivalued flash memory 94, the two-valued memory space is assigned universal physical addresses C000h to C0FFh at which part of the management data, namely management data IV, is stored; and the multivalued memory space 21 is assigned universal physical addresses C100h to FFFFh at which part of the user data, namely user data IV, is stored.

Figure 8:
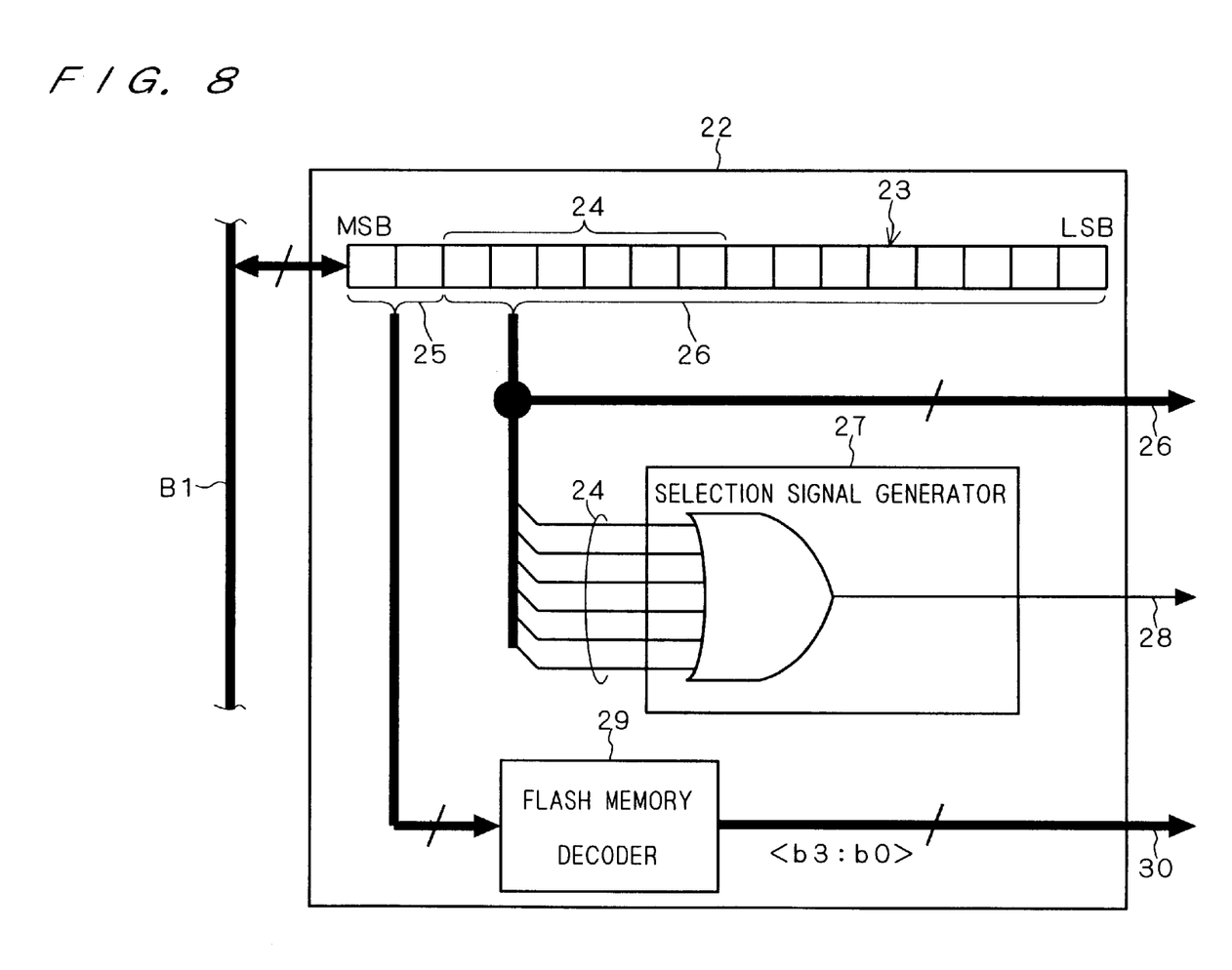
FIG. 8 is a block diagram of another configuration according to the second preferred embodiment.

FIG. 8 is a block diagram of a general construction of the two-valued/multivalued selector 22. The two-valued/multivalued selector 22, which is connected to the CPU 4 via the bus B1, comprises a physical address register 23 for storing an universal physical address. Two bits of the universal physical address, including the most significant bit MSB and the next low-order bit, serve as selection bits 25, and the remaining 14 bits as an individual physical address 26.

The individual physical address 26 is given to the flash interface 6. The selection bits 25, on the other hand, are given to a flash memory decoder 29 in the two-valued/multivalued selector 22. The flash memory decoder 29 generates the flash memory selection signal 30.

Like the flash memory selection signal 17, the flash memory selection signal 30 is 4 bits in length <b3:b0>. Of the bits b0, b1, b2, and b3, only one bit becomes LOW in response to the selection bits 25 (i.e., b0 for "00", b1 for "01", b2 for "10", and b3 for "11") and the other bits become HIGH. The bits b0 to b3 serve as chip enable signals which enable access to the two-valued/multivalued flash memories 91 to 94, respectively. Thus, the flash memory decoder 16 in the first preferred embodiment may be used as the flash memory decoder 29.

The selection signal 28 is active LOW only when the universal physical address is in the range of 0000h to 00FFh, 4000h to 40FFh, 8000h to 80FFh, and C000h to C0FFh. That is, the selection signal 28 becomes LOW only when the 2 high-order hexadecimal digits of the universal physical address are any of "00", "40", "80", and "C0" and becomes HIGH at all other times. Thus, a selection signal generator 27 in the two-valued/multivalued selector 22 provides the function of calculating the logical OR of 6 bits 24 in bit positions 8–13 where the least significant bit LSB of the universal physical address is in bit position 0 and the most significant bit MSB in bit position 15 to generate the selection signal 28.

Figure 9:
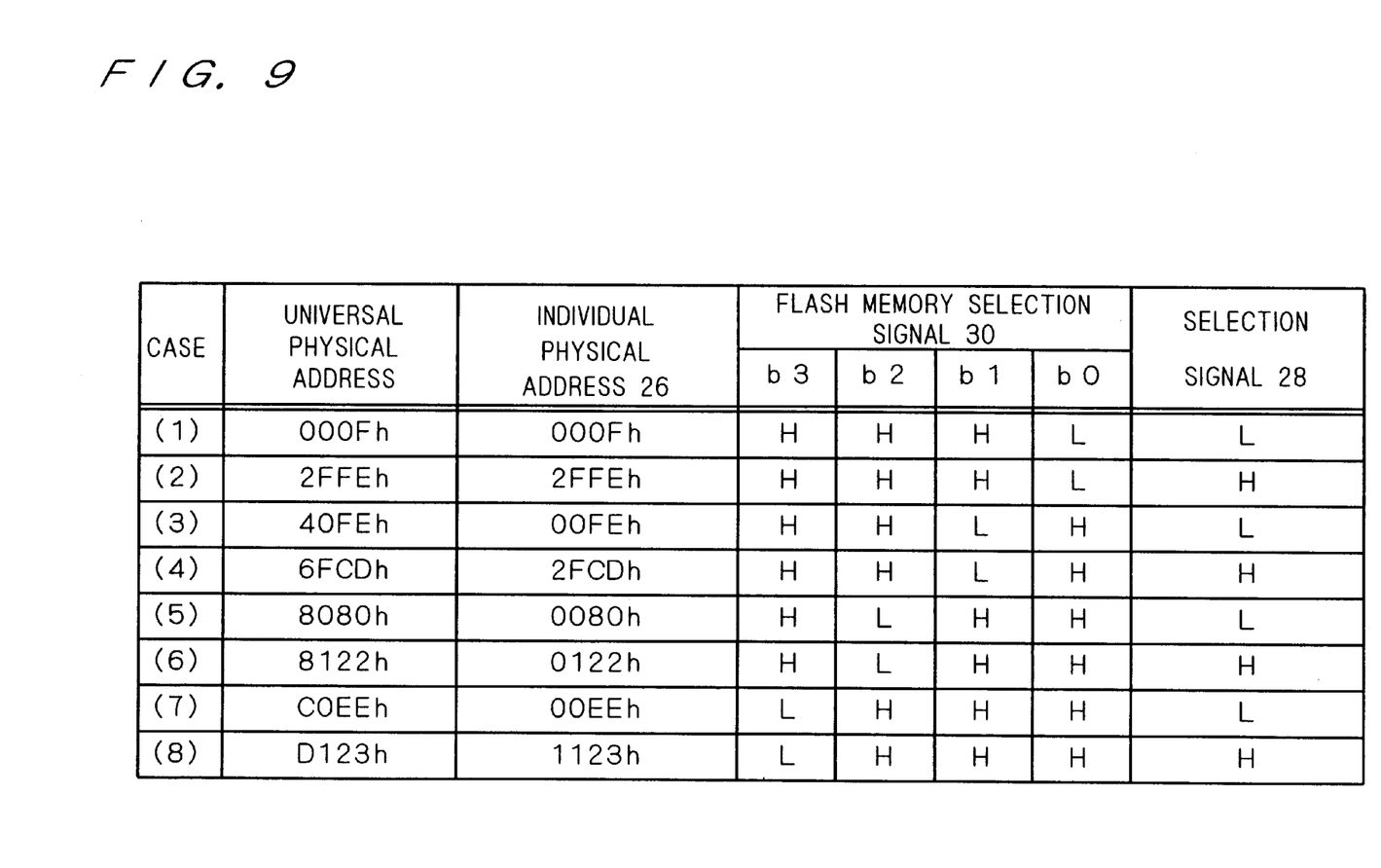
FIG. 9 illustrates the operation according to the second preferred embodiment.

FIG. 9 shows the relative relations of the universal physical address, the individual physical address 26, the flash memory selection signal 30, and the selection signal 28 in various cases. In the case (1) for a universal physical address "000Fh", the selection bits 25 are "00" and the individual physical address 26 is "000Fh". Thus, only the bit b0 of the flash memory selection signal 30 becomes LOW and the bits b1, b2 and b3 become HIGH. This enables access to only the two-valued/multivalued flash memory 91, wherein the universal physical address "000Fh" corresponds to the individual physical address "000Fh". Further, since the 6 bits 24 are "000000", the selection signal 28 becomes LOW, and the flash interface 6, upon receiving that signal, activates the function of the two-valued flash sequencer 6*a*. Accordingly, the two-valued memory space 20 in the two-valued/multivalued flash memory 91 is accessed for input or output of the management data I.

In the case (2) for a universal physical address "2FFEh", the selection bits 25 are "00" and the individual physical address 26 is "2FFEh". Thus, only the bit b0 of the flash memory selection signal 30 becomes LOW and the bits b1, b2 and b3 become HIGH. This enables access to only the two-valued/multivalued flash memory 91, wherein the universal physical address "2FFEh" corresponds to the individual physical address "2FFEh". Further, since the 6 bits 24 are "101111", the selection signal 28 becomes HIGH, and the flash interface 6, upon receiving that signal, activates the function of the multivalued flash sequencer 6*b*. Accordingly, the multivalued memory space 21 in the two-valued/multivalued flash memory 91 is accessed for input or output of the user data I.

In the case (3) for a universal physical address "40FEh", the selection bits 25 are "01" and the individual physical address 26 is "00FEh". Thus, only the bit b1 of the flash memory selection signal 30 becomes LOW and the bits b0, b2 and b3 become HIGH. This enables access to only the two-valued/multivalued flash memory 92, wherein the universal physical address "40FEh" corresponds to the individual physical address "00FEh". Further, since the 6 bits 24 are "000000", the selection signal 28 becomes LOW, and the flash interface 6, upon receiving that signal, activates the function of the two-valued flash sequencer 6*a*. Accordingly, the two-valued memory space 20 in the two-valued/multivalued flash memory 92 is accessed for input or output of the management data II.

In the case (4) for a universal physical address "6FCDh", the selection bits 25 are "01" and the individual physical address 26 is "2FCDh". Thus, only the bit b1 of the flash memory selection signal 30 becomes LOW and the bits b0, b2 and b3 become HIGH. This enables access to only the two-valued/multivalued flash memory 92, wherein the universal physical address "6FCDh" corresponds to the individual physical address "2FCDh". Further, since the 6 bits 24 are "101111", the selection signal 28 becomes HIGH, and the flash interface 6, upon receiving that signal, activates the function of the multivalued flash sequencer 6*b*. Accordingly, the multivalued memory space 21 in the two-valued/multivalued flash memory 92 is accessed for input or output of the user data II.

In the case (5) for a universal physical address "8080h", the selection bits 25 are "10" and the individual physical address 26 is "0080h". Thus, only the bit b2 of the flash memory selection signal 30 becomes LOW and the bits b0, b1 and b3 become HIGH. This enables access to only the two-valued/multivalued flash memory 93, wherein the universal physical address "8080h" corresponds to the individual physical address "0080h". Further, since the 6 bits 24 are "000000", the selection signal 28 becomes LOW, and the flash interface 6, upon receiving that signal, activates the function of the two-valued flash sequencer 6*a*. Accordingly, the two-valued memory space 20 in the two-valued/multivalued flash memory 93 is accessed for input or output of the management data III.

In the case (6) for a universal physical address "8122h", the selection bits 25 are "10" and the individual physical address 26 is "0122h". Thus, only the bit b2 of the flash memory selection signal 30 becomes LOW and the bits b0, b1 and b3 become HIGH. This enables access to only the two-valued/multivalued flash memory 93, wherein the universal physical address "8122h" corresponds to the individual physical address "0122h". Further, since the 6 bits 24 are "000001", the selection signal 28 becomes HIGH, and the flash interface 6, upon receiving that signal, activates the function of the multivalued flash sequencer 6b. Accordingly, the multivalued memory space 21 in the two-valued/multivalued flash memory 93 is accessed for input and output of the user data III.

In the case (7) for a universal physical address "C0EEh", the selection bits 25 are "11" and the individual physical address 26 is "00EEh". Thus, only the bit b3 of the flash memory selection signal 30 becomes LOW and the bits b0, b1 and b2 become HIGH. This enables access to only the two-valued/multivalued flash memory 94, wherein the universal physical address "C0EEh" corresponds to the individual physical address "00EEh". Further, since the 6 bits 24 are "000000", the selection signal 28 becomes LOW, and the flash interface 6, upon receiving that signal, activates the function of the two-valued flash sequencer 6a. Accordingly, the two-valued memory space 20 in the two-valued/multivalued flash memory 94 is accessed for input or output of the management data IV.

In the case (8) for a universal physical address "D123h", the selection bits 25 are "11" and the individual physical address 26 is "1123h". Thus, only the bit b3 of the flash memory selection signal 30 becomes LOW and the bits b0, b1 and b2 become HIGH. This enables access to only the two-valued/multivalued flash memory 94, wherein the universal physical address "D123h" corresponds to the individual physical address "1123h". Further, since the 6 bits 24 are "010001", the selection signal 28 becomes HIGH, and the flash interface 6, upon receiving that signal, activates the function of the multivalued flash sequencer 6b. Accordingly, the multivalued memory space 21 in the two-valued/multivalued flash memory 94 is accessed for input and output of the user data IV.

As have been described, the flash memories 91 to 94 each mixing the two-valued memory space 20 and the multivalued memory space 21 are provided in the flash memory group 22 so that the management data and the user data are divided among those flash memories. This achieves higher transfer rate and larger storage capacity.

Further, while the CPU 4 uses the universal physical addresses which handle individual physical data in a uniform manner, the two-valued/multivalued selector 22 and the flash interface 6 makes translation between such universal physical addresses and the individual physical addresses thereby to divide data to be stored among the two-valued/multivalued flash memories 91 to 94, and more specifically, among their respective two-valued memory spaces 20 and multivalued memory spaces 21. Especially the universal physical addresses each including the selection bits 25 and the individual physical address 26 facilitate such division. Thus, it is not necessary for the CPU 4 during processing to consider the above mixture of the flash memories in the flash memory group 200 and to make significant modification to the program 5.

While the invention has been shown and described in detail, the foregoing description is in all aspects illustrative and not restrictive. It is therefore understood that numerous modifications and variations can be devised without departing from the scope of the invention.

What is claimed is:

1. A storage device comprising:
    a first storage area configured to have a storage state read with a single readout voltage, and having a first set of physical addresses;
    a second storage area configured to have a storage state read with a plurality of readout voltages, and having a second set of physical addresses; and
    a CPU configured to control said first storage area and said second storage area using a universal set of physical addresses which correspond to the first set of physical addresses and the second set of physical addresses,
    wherein said first storage area stores management data and said second storage area stores user data.
2. The storage device according to claim 1, wherein both said first and second storage areas are flash memories.
3. The storage device according to claim 2, wherein said second storage memory is a four-valued flash memory.
4. The storage device according to claim 1, wherein said first and second storage areas each have a sector structure.
5. The storage device according to claim 4, wherein said universal physical addresses each include a selection bit for use in determining in which of said first and second storage areas one of said individual physical addresses is to be used, and bits indicating said one of said individual physical addresses.
6. The storage device according to claim 5, further comprising:
    first and second sequencers controlling operations of said first and second storage areas, respectively,
    wherein either one of said first and second sequencers operates based on said selection bit.
7. A storage device comprising:
    a plurality of storage groups, each storage group including
        a first storage area having a first set of physical addresses configured to store management data, and to have a storage state read with a single readout voltage, and
        a second storage area having a second set of physical addresses configured to store user data and to have a storage state read with a plurality of readout voltages; and
    a CPU configured to control the plurality of storage groups using a universal set of physical addresses which correspond to the respective first set of physical addresses of the respective first storage areas of the plurality of storage groups and the respective second set of physical addresses of the respective second storage areas of the plurality of storage groups.
8. The storage device according to claim 7, wherein both said first and second storage areas are flash memories.
9. The storage device according to claim 8, wherein said second storage area is a four-valued memory.
10. The storage device according to claim 7, wherein said first and second storage areas each have a sector structure.
11. The storage device according to claim 10, wherein said universal physical addresses each include a selection bit for use in determining in which of said first and second storage areas one of said individual physical addresses is to be used, and bits indicating said one of said individual physical addresses.
12. The storage device according to claim 11, further comprising:
    first and second sequencers for controlling operations of said first and second storage areas, respectively,
    wherein either one of said first and second sequencers operates based on said selection bit.

* * * * *

UNITED STATES PATENT AND TRADEMARK OFFICE
CERTIFICATE OF CORRECTION

PATENT NO.   : 6,363,009
DATED        : March 26, 2002
INVENTOR(S)  : Fukuzumi

It is certified that error appears in the above-identified patent and that said Letters Patent is hereby corrected as shown below:

<u>Title page,</u>
On the Title page, the Foreign Application Data is listed incorrectly. It should read:

-- [30]             Foreign Application Data

Apr. 20, 2000   (JP) ………………….. 2000-119323 --

Signed and Sealed this

Third day of September, 2002

Attest:

Attesting Officer

JAMES E. ROGAN
*Director of the United States Patent and Trademark Office*